(12) United States Patent
Ochi et al.

(10) Patent No.: US 8,745,859 B2
(45) Date of Patent: Jun. 10, 2014

(54) COMPONENT BUILT-IN MODULE, AND MANUFACTURING METHOD FOR COMPONENT BUILT-IN MODULE

(75) Inventors: Shozo Ochi, Osaka (JP); Yoshitake Hayashi, Osaka (JP); Kazuo Ohtani, Osaka (JP); Yosuke Maeba, Osaka (JP)

(73) Assignee: Panasonic Corporation, Osaka (JP)

( * ) Notice: Subject to any disclaimer, the term of this patent is extended or adjusted under 35 U.S.C. 154(b) by 192 days.

(21) Appl. No.: 13/472,591

(22) Filed: May 16, 2012

(65) Prior Publication Data

US 2012/0293965 A1 Nov. 22, 2012

(30) Foreign Application Priority Data

May 20, 2011 (JP) ................................. 2011-113407

(51) Int. Cl.
*H05K 1/02* (2006.01)

(52) U.S. Cl.
USPC ............. 29/829; 361/761; 174/252; 438/106; 438/112; 257/666; 257/668; 257/697

(58) Field of Classification Search
USPC ............. 29/829; 361/761; 174/252; 438/106, 438/112; 257/666, 668, 69
See application file for complete search history.

(56) References Cited

U.S. PATENT DOCUMENTS

| | | | |
|---|---|---|---|
| 6,038,133 A | | 3/2000 | Nakatani et al. |
| 6,379,997 B1 * | | 4/2002 | Kawahara et al. ............ 438/106 |
| 2010/0200277 A1 * | | 8/2010 | Huang et al. .................. 174/252 |

FOREIGN PATENT DOCUMENTS

| | | |
|---|---|---|
| JP | 11-220262 A | 8/1999 |
| JP | 2004-319701 A | 11/2004 |

* cited by examiner

*Primary Examiner* — Xiaoliang Chen
(74) *Attorney, Agent, or Firm* — RatnerPrestia

(57) ABSTRACT

A manufacturing method for a component built-in module, including: forming, in a sheet member including resin, a via hole filled up with a conductive paste, a cavity in which an electronic component is to be built, and an adjustment space; and performing a heat press allowing the sheet member to abut against a substrate on which the electronic component has been mounted, wherein the adjustment space is formed so that a flow vector of the resin in a neighborhood of the via hole during the heat press, which is directed toward the electronic component, is cancelled by a flow vector of the resin in a neighborhood of the via hole during the heat press, which is directed toward the adjustment space.

9 Claims, 15 Drawing Sheets

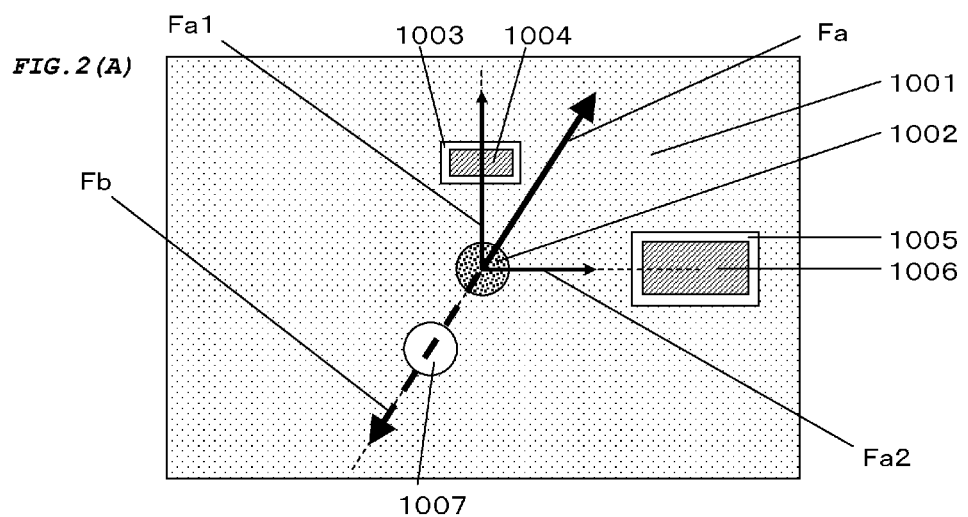
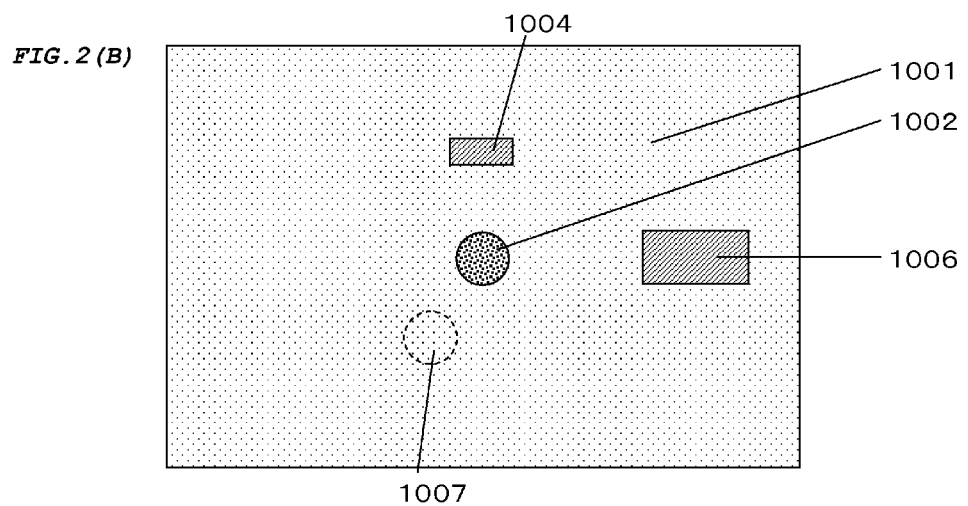

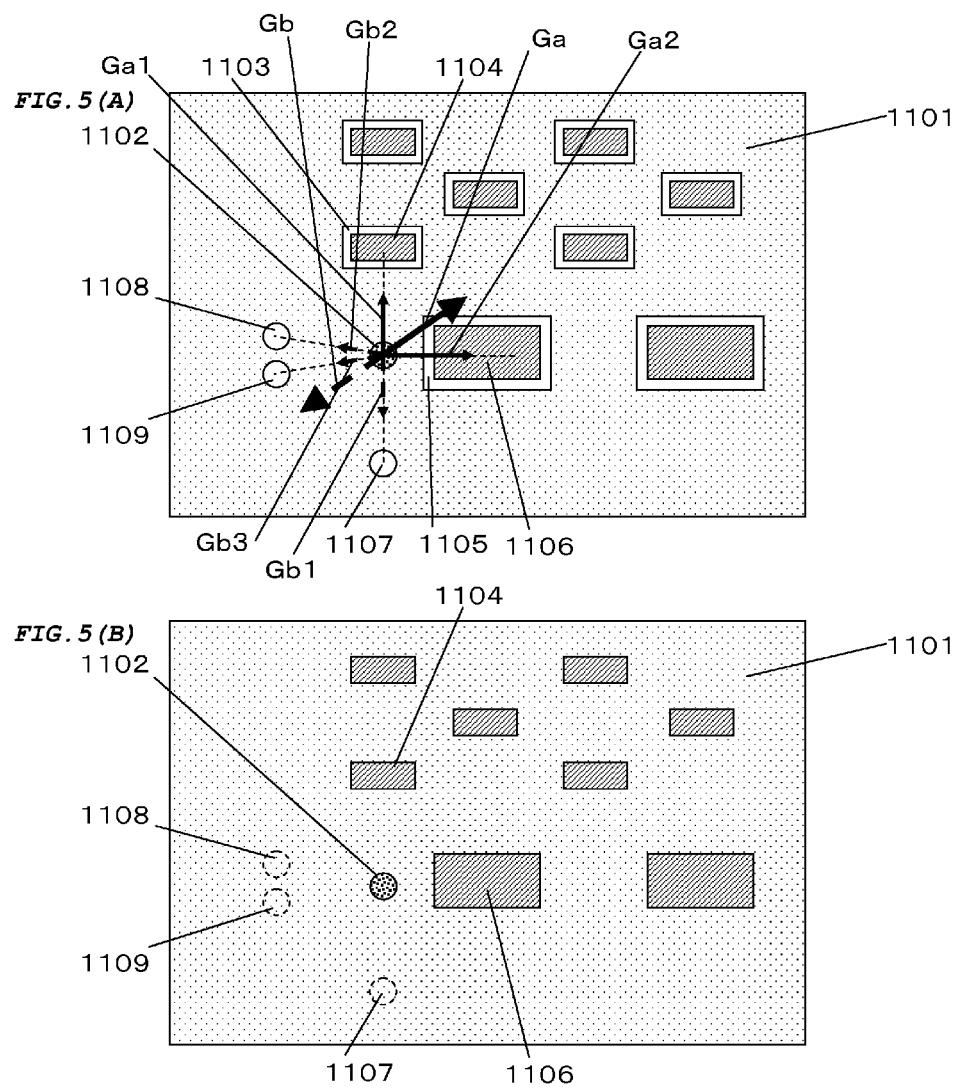

1203
1202a
1201
1202b 1211    1204

1204
1202c

1205

1206

1210

102a
101
102b

105

106

120

COMPONENT BUILT-IN MODULE, AND MANUFACTURING METHOD FOR COMPONENT BUILT-IN MODULE

BACKGROUND OF THE INVENTION

1. Field of the Invention

The present invention relates to a component built-in module, and a manufacturing method for the component built-in module, which are for having electronic components built-in using electric insulating sheet members, for example.

2. Related Art of the Invention

Recently, a demand for downsizing and weight reduction, and a high-function and high-performance of electronic equipment has been getting more and more intense, and the amount of data handled has been increasing dramatically.

Hence, high density mounting of electronic components is demanded of wiring substrates used for electronic equipment.

In order to mount electronic components in high density, development of three-dimensional mounting technology has been performed for, in wiring substrates, fabricating thin-film electronic components, or having semiconductors, capacitors and the like built-in, which are existing electronic components.

One example of such a three-dimensional mounting technology is a component built-in module having active components such as semiconductors and the like and passive components such as capacitors and the like embedded in electric insulating sheet members including inorganic filler and heat-hardening resin.

Since particulate-like inorganic filler is included in plenty, electronic components can be embedded easily in the component built-in module with high heat dissipation and low permittivity.

And, since short wiring is formed and shielding effect can also be produced, a component built-in module with high noise immunity is useful as a wiring substrate coping with high frequency operation such that three-dimensional mounting is performed in high density.

Meanwhile, as a method of obtaining conduction between upper and lower wiring patterns in the component built-in module, a method is known that forms via holes in sheet members, and forms via conductors by filling the said via holes with a conductive paste (see, for example, Japanese Patent Laid-Open No. Hei 11-220262).

Here, mainly with reference to FIGS. 9 to 13, such a conventional manufacturing method for a component built-in module is concretely described.

Further, FIG. 9(A) is a schematic vertical sectional view for describing the gluing of the protective films 102a and 102b related to the formation of the sheet member 110 in which the cavity 104 is formed, in the formation step of the first conventional manufacturing method for the component built-in module, FIG. 9(B) is a schematic vertical sectional view for describing the formation of the cavity 104 related to the formation of the sheet member 110 in which the cavity 104 is formed, in the formation step of the first conventional manufacturing method for the component built-in module, FIG. 9(C) is a schematic vertical sectional view for describing the gluing of the new protective film 102c related to the formation of the sheet member 110 in which the cavity 104 is formed, in the formation step of the first conventional manufacturing method for the component built-in module, FIG. 9(D) is a schematic vertical sectional view for describing the formation of the via hole 105 related to the formation of the sheet member 110 in which the cavity 104 is formed, in the formation step of the first conventional manufacturing method for the component built-in module, FIG. 9(E) is a schematic vertical sectional view for describing the filling up with the conductive paste 106 related to the formation of the sheet member 110 in which the cavity 104 is formed, in the formation step of the first conventional manufacturing method for the component built-in module, and FIG. 9(F) is a schematic vertical sectional view for describing the peel-off of the protective films 102b and 102c related to the formation of the sheet member 110 in which the cavity 104 is formed, in the formation step of the first conventional manufacturing method for the component built-in module.

Furthermore, FIG. 10(A) is a schematic vertical sectional view for describing the gluing of the protective films 102a and 102b related to the formation of the sheet member 120 in which the cavity 104 is not formed, in the formation step of the first conventional manufacturing method for the component built-in module, FIG. 10(B) is a schematic vertical sectional view for describing the formation of the via hole 105 related to the formation of the sheet member 120 in which the cavity 104 is not formed, in the formation step of the first conventional manufacturing method for the component built-in module, FIG. 10(C) is a schematic vertical sectional view for describing the filling up with the conductive paste 106 related to the formation of the sheet member 120 in which the cavity 104 is not formed, in the formation step of the first conventional manufacturing method for the component built-in module, and FIG. 10(D) is a schematic vertical sectional view for describing the peel-off of the protective films 102a and 102b related to the formation of the sheet member 120 in which the cavity 104 is not formed, in the formation step of the first conventional manufacturing method for the component built-in module.

Furthermore, FIG. 11(A) is a schematic vertical sectional view for describing a state before a heat press in the heat press step of the first conventional manufacturing method for the component built-in module, FIG. 11(B) is a schematic vertical sectional view for describing a state during a heat press in the heat press step of the first conventional manufacturing method for the component built-in module, and FIG. 11(C) is a schematic vertical sectional view for describing a state after a heat press in the heat press step of the first conventional manufacturing method for the component built-in module.

Furthermore, FIG. 12(A) is a schematic horizontal sectional view for describing a state during a heat press in the heat press step of the second conventional manufacturing method for the component built-in module, and FIG. 12(B) is a schematic horizontal sectional view for describing a state after a heat press in the heat press step of the second conventional manufacturing method for the component built-in module.

Furthermore, FIG. 13(A) is a schematic horizontal sectional view for describing a state during a heat press in the heat press step of the third conventional manufacturing method for the component built-in module, and FIG. 13(B) is a schematic horizontal sectional view for describing a state after a heat press in the heat press step of the third conventional manufacturing method for the component built-in module.

Here, a horizontal sectional view means a sectional view taken by cutting with a horizontal plane parallel to the sheet member, and a vertical sectional view means a sectional view taken by cutting with a vertical plane perpendicular to the said horizontal plane (the same shall apply hereinafter in this regard).

As shown in FIG. 9(A), a sheet member 103 with thickness of about 100 μm is formed by gluing protective films 102a and 102b onto both faces of an unhardened composite sheet 101.

As shown in FIG. 9(B), a cavity 104 according to the shape of a built-in electronic component 131 (see FIG. 11(A)) is formed in the sheet member 103 by any of laser processing, punch processing and drill processing.

As shown in FIG. 9(C), an opening of the cavity 104 is stopped up by gluing a new protective film 102c after peeling off the protective film 102a on one side.

As shown in FIG. 9(D), a via hole 105 penetrating the sheet member 103 is formed by any of laser processing, punch processing and drill processing.

As shown in FIG. 9(E), the via hole 105 is filled up with a conductive paste 106 using a means such as a printing process and the like.

As shown in FIG. 9(F), a sheet member 110 is completed by peeling off the protective films 102b and 102c.

As shown in FIGS. 10(A) to 10(D), a sheet member 120 is prepared by a process that is, except that the cavity 104 is not formed, similar to the process of forming the sheet member 110 described above.

Here, the sheet member 120 fulfills the role of preventing the interference between the built-in electronic component 131 (see FIG. 11(A)) and a second wiring substrate 140 (see FIG. 11(A)).

As shown in FIG. 11(A), two sheet members 110 in which cavities 104 (see FIG. 9(B)) are provided; the sheet member 120; a first wiring substrate 130 including a first wiring pattern 132, and the electronic component 131 mounted on the first wiring pattern 132; and the second wiring substrate 140 including a second wiring pattern 141 are aligned.

As shown in FIG. 11(B), a heat press is performed against the two sheet members 110, the sheet member 120, the first wiring substrate 130, and the second wiring substrate 140, which are aligned and stacked up.

As shown in FIG. 11(C), the component built-in module is finally manufactured in which the first wiring pattern 132 and the second wiring pattern 141 are electrically connected by a via conductor 151 formed using the conductive paste 106 (see FIG. 9(E) and FIG. 10(C)).

In the conventional manufacturing method for the component built-in module like this, since, as shown in FIG. 11(B), there is a gap 133 between the electronic component 131 and a wall surface of the cavity 104, a via flow is often generated that is a phenomenon in which the resin forming the sheet members 110 and 120 flows due to heating and pressurization through a heat press.

Consequently, the via conductor 151 is deformed due to the via flow, and an electrical connection defect sometimes occurs.

Meanwhile, a method is known that forms beforehand a sub space for internal volume adjustment in a sheet member, in order to suppress such a via flow (see, for example, Japanese Patent Laid-Open No. 2004-319701).

Here, mainly with reference to FIGS. 14 and 15, such a conventional manufacturing method for a component built-in module is concretely described.

Further, FIG. 14 is a schematic vertical sectional view for describing a state before a heat press in the heat press step of the fourth conventional manufacturing method for the component built-in module.

Furthermore, FIG. 15(A) is a schematic horizontal sectional view for describing a state during a heat press in the heat press step of the fourth conventional manufacturing method for the component built-in module, and FIG. 15(B) is a schematic horizontal sectional view for describing a state after a heat press in the heat press step of the fourth conventional manufacturing method for the component built-in module.

As shown in FIG. 14, in the conventional manufacturing method for the component built-in module like this, a via hole 502 filled up with a conductive paste is formed in a sheet member 501, an electronic component 504 is arranged in a cavity 503, and a sub space 505 is formed.

The said component built-in module comprises a via conductor 506 formed using the conductive paste with which the via hole 502 is filled up, the electronic component 504, and the sub space 505 filled up at least with resin.

The volume of the sub space 505 is approximately the same as the volume of a gap between the electronic component 504 and a wall surface of the cavity 503, and a via flow is suppressed.

SUMMARY OF THE INVENTION

However, also in the conventional manufacturing method for the component built-in module that forms the sub space for internal volume adjustment described above, it turns out that there is a disadvantage in sufficiently suppressing a via flow in order to perform manufacturing of more high-quality component built-in modules.

Analysis of the present inventors showed that the cause of the disadvantage is that, although the volume of the gap between an electronic component and a wall surface of a cavity was considered, the arrangement direction of an electronic component, the distance between a via hole and an electronic component and the like were not considered at all.

More concretely, the present inventors noticed that a situation arises in which, as shown in FIG. 15, the via conductor 506, the electronic component 504, and the sub space 505 are not aligned on a line and, even if the volume of the sub space 505 is the same as the volume of a gap between the electronic component 504 and the wall surface of the cavity 503, a via flow is not sufficiently suppressed.

And, the present inventors consider that, in a realistic case where there are plural built-in electronic components, the situation is more complicated.

For example, the present inventors noticed that, even if the total volume of the gaps between an electronic component and a wall surface of a cavity is the same, the direction and amount of flow of a via flow is different with respect to:

the case where, as shown in FIG. 12, a via hole 602 filled up with a conductive paste is formed in a sheet member 601, an electronic component 604 is arranged in a cavity 603, and an electronic component 606 is arranged in a cavity 605; and the case where, as shown in FIG. 13, a via hole 702 filled up with a conductive paste is formed in a sheet member 701, an electronic component 704 is arranged in a cavity 703, and an electronic component 706 is arranged in a cavity 705.

In short, the present inventors consider that it is important to estimate the direction and amount of flow of a via flow in consideration of the arrangement direction of an electronic component and the distance between a via hole and an electronic component, not to mention the volume of the gap between an electronic component and a wall surface of a cavity, to form an adjustment space with appropriate arrangement direction, volume, and distance.

The present invention, in view of the conventional problems described above, provides a component built-in module, and a manufacturing method for the component built-in module, which are capable of suppressing a via flow that could be a cause of an electrical connection defect.

The $1^{st}$ aspect of the present invention is a manufacturing method for a component built-in module, comprising:

forming, in a sheet member including resin, a via hole filled up with a conductive paste, a cavity in which an electronic component is to be built, and an adjustment space; and performing a heat press allowing the sheet member to abut against a substrate on which the electronic component has been mounted, wherein the adjustment space is formed so that a flow vector of the resin in a neighborhood of the via hole during the heat press, which is directed toward the electronic component, is cancelled by a flow vector of the resin in a neighborhood of the via hole during the heat press, which is directed toward the adjustment space.

The $2^{nd}$ aspect of the present invention is a manufacturing method for a component built-in module according to the $1^{st}$ aspect of the present invention, wherein the flow vector directed toward the electronic component has a direction that is parallel with the sheet member, and has a magnitude that is proportional to a volume of a gap between the electronic component and a wall surface of the cavity and that is inversely proportional to a square of a distance between the via hole and the electronic component, and the flow vector directed toward the adjustment space has a direction that is parallel with the sheet member, and has a magnitude that is proportional to a volume of the adjustment space and that is inversely proportional to a square of a distance between the via hole and the adjustment space.

The $3^{rd}$ aspect of the present invention is a manufacturing method for a component built-in module according to the $2^{nd}$ aspect of the present invention, wherein a plurality of the electronic components and the cavities are formed respectively, and the flow vector directed toward the electronic component is a composite vector composed of all or part of the flow vectors directed toward the respective electronic components.

The $4^{th}$ aspect of the present invention is a manufacturing method for a component built-in module according to the $3^{rd}$ aspect of the present invention, wherein the flow vector directed toward the electronic component is a composite vector composed of flow vectors of a part of the flow vectors directed toward the respective electronic components.

The $5^{th}$ aspect of the present invention is a manufacturing method for a component built-in module according to the $2^{nd}$ aspect of the present invention, wherein a plurality of the adjustment spaces are formed, and the flow vector directed toward the adjustment space is a composite vector composed of the flow vectors directed toward the respective adjustment spaces.

The $6^{th}$ aspect of the present invention is a manufacturing method for a component built-in module according to the $1^{st}$ aspect of the present invention, wherein the resin is a heat-hardening resin, and the sheet member includes an inorganic filler.

The $7^{th}$ aspect of the present invention is a manufacturing method for a component built-in module according to the $1^{st}$ aspect of the present invention, wherein the sheet member includes a core member of any of glass woven fabric, glass nonwoven fabric, aramid woven fabric, and aramid nonwoven fabric.

The $8^{th}$ aspect of the present invention is a manufacturing method for a component built-in module according to the $7^{th}$ aspect of the present invention, wherein the adjustment space is filled up only with the resin during the heat press.

The $9^{th}$ aspect of the present invention is a manufacturing method for a component built-in module according to the $1^{st}$ aspect of the present invention, wherein the electronic component is an active component or a passive component.

The $10^{th}$ aspect of the present invention is a component built-in module, comprising: a via conductor; an electronic component; and an adjustment space filled up at least with resin, wherein the via conductor, the electronic component, and the adjustment space are aligned on a line.

By the present invention, it is possible to provide a component built-in module, and a manufacturing method for the component built-in module, which are capable of suppressing a via flow that could be a cause of an electrical connection defect.

BRIEF DESCRIPTION OF THE DRAWINGS

FIG. 2(A) is a schematic horizontal sectional view for describing a state during a heat press in the heat press step of the manufacturing method for the component built-in module pertaining to the second embodiment in the present invention, and FIG. 2(B) is a schematic horizontal sectional view for describing a state after a heat press in the heat press step of the manufacturing method for the component built-in module pertaining to the second embodiment in the present invention;

FIG. 5(A) is a schematic horizontal sectional view for describing a state during a heat press in the heat press step of the manufacturing method for the component built-in module pertaining to the third embodiment in the present invention, and FIG. 5(B) is a schematic horizontal sectional view for describing a state after a heat press in the heat press step of the manufacturing method for the component built-in module pertaining to the third embodiment in the present invention;

Figure 1A:
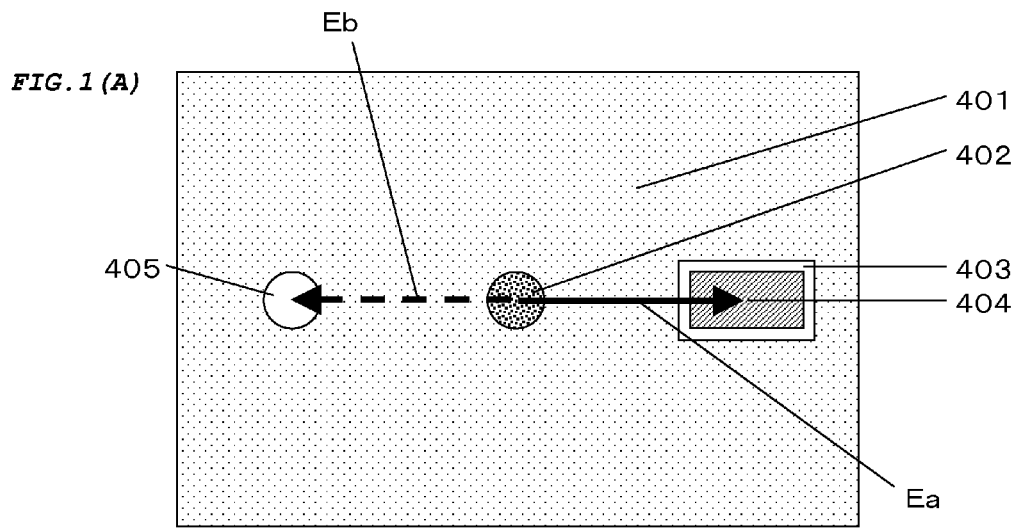
FIG. 1(A) is a schematic horizontal sectional view for describing a state during a heat press in the heat press step of the manufacturing method for the component built-in module pertaining to the first embodiment in the present invention.

DESCRIPTION OF SYMBOLS 401 sheet member
402 via hole
403 cavity
404 electronic component
405 adjustment space
406 via conductor

PREFERRED EMBODIMENTS OF THE INVENTION

Hereafter, with reference to the drawings, embodiments of the present invention are described in detail.

First Embodiment

Mainly with reference to FIG. 1, a component built-in module, and a manufacturing method for the component built-in module pertaining to the present embodiment are described.

Figure 1B:
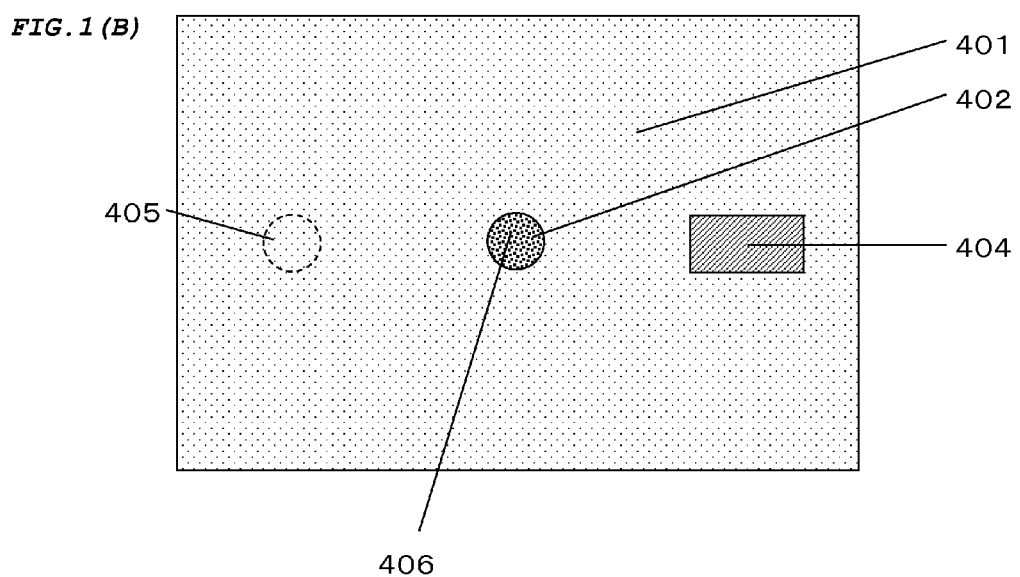
FIG. 1(B) is a schematic horizontal sectional view for describing a state after a heat press in the heat press step of the manufacturing method for the component built-in module pertaining to the first embodiment in the present invention.

Further, FIG. 1(A) is a schematic horizontal sectional view for describing a state during a heat press in the heat press step of the manufacturing method for the component built-in module pertaining to the first embodiment in the present invention, and FIG. 1(B) is a schematic horizontal sectional view for describing a state after a heat press in the heat press step of the manufacturing method for the component built-in module pertaining to the first embodiment in the present invention.

Figure 4A:
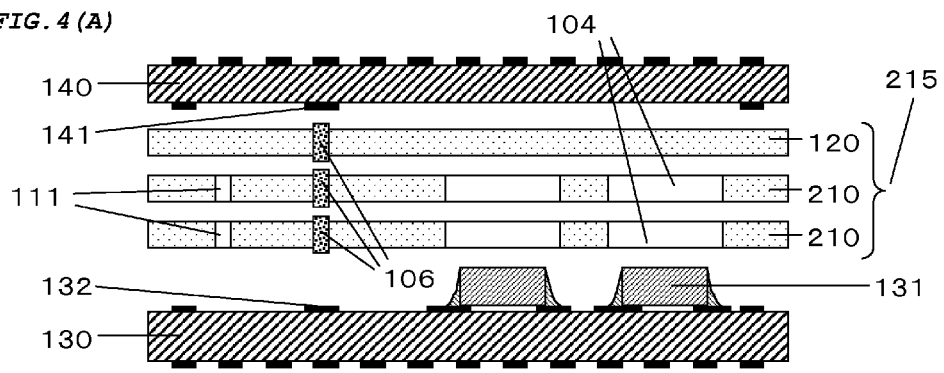
FIG. 4(A) is a schematic vertical sectional view for describing a state before a heat press in the heat press step of the manufacturing method for the component built-in module pertaining to the second embodiment in the present invention.

The manufacturing method for the component built-in module pertaining to the present embodiment comprises a formation step of, in a sheet member 401 including resin, forming a via hole 402 filled up with a conductive paste, a cavity 403 in which an electronic component 404 is to be built, and an adjustment space 405, and a heat press step of performing a heat press allowing the sheet member 401 to abut against a substrate 130 (see FIG. 4(A)) on which the electronic component 404 has been mounted.

The adjustment space 405 formed in the formation step is formed so that a flow vector Ea of the resin in a neighborhood of the via hole 402 during the heat press, which is directed toward the electronic component 404, is cancelled by a flow vector Eb of the resin in a neighborhood of the via hole 402 during the heat press, which is directed toward the adjustment space 405.

The flow vector Ea directed toward the electronic component 404 has a direction that is parallel with the sheet member 401, and has a magnitude that is proportional to a volume of a gap between the electronic component 404 and a wall surface of the cavity 403 and that is inversely proportional to a square of a distance between the via hole 402 and the electronic component 404.

The flow vector Eb directed toward the adjustment space 405 has a direction that is parallel with the sheet member 401, and has a magnitude that is proportional to a volume of the adjustment space 405 and that is inversely proportional to a square of a distance between the via hole 402 and the adjustment space 405.

The component built-in module pertaining to the present embodiment comprises a via conductor 406, the electronic component 404, and the adjustment space 405 filled up at least with resin.

The via conductor 406, the electronic component 404, and the adjustment space 405 are aligned on a line.

Next, the manufacturing method for the component built-in module pertaining to the present embodiment is described in more detail.

As shown in FIG. 1(A), in the manufacturing method for the component built-in module pertaining to the present embodiment, the via hole 402 filled up with a conductive paste is formed in the sheet member 401, and the electronic component 404 is arranged in the cavity 403.

And, in the manufacturing method for the component built-in module pertaining to the present embodiment, the adjustment space 405 is formed so that the resin flow in a neighborhood of the via hole 402 is balanced isotropically.

Namely,
i) the adjustment space 405 is allowed to be formed substantially on just the opposite side of the electronic component 404 with reference to the via hole 402,
ii) the volume of the adjustment space 405 is allowed to be the same as the volume of the gap between the electronic component 404 and the wall surface of the cavity 403, and
iii) the distance between the center of the via hole 402 and the center of the adjustment space 405 is allowed to be the same as the distance between the center of the via hole 402 and the center of the electronic component 404.

Hence, as shown in FIG. 1(B), it is possible to suppress a via flow due to a heat press.

In this way, in the manufacturing method for the component built-in module pertaining to the present embodiment, the direction and amount of flow of a via flow is estimated in consideration of the arrangement direction of an electronic component and the distance between a via hole and an electronic component, not to mention the volume of the gap between an electronic component and a wall surface of a cavity, and an adjustment space is formed with appropriate arrangement direction, volume, and distance.

Thus, since an adjustment space is formed so that the resin flow in a neighborhood of a via hole is balanced isotropically, a via flow is suppressed, and it becomes possible to cheaply provide a component built-in module with excellent electrical connection realized.

Second Embodiment

Mainly with reference to FIG. 2, a component built-in module, and a manufacturing method for the component built-in module pertaining to the present embodiment are described.

Further, FIG. 2(A) is a schematic horizontal sectional view for describing a state during a heat press in the heat press step of the manufacturing method for the component built-in module pertaining to the second embodiment in the present invention, and FIG. 2(B) is a schematic horizontal sectional view for describing a state after a heat press in the heat press step of the manufacturing method for the component built-in module pertaining to the second embodiment in the present invention.

Figure 4B:
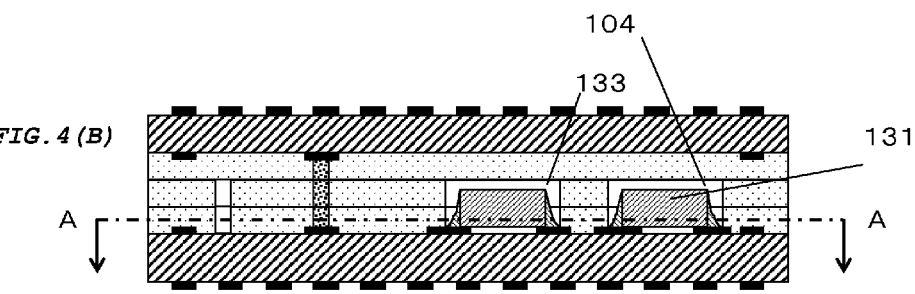
FIG. 4(B) is a schematic vertical sectional view for describing a state during a heat press in the heat press step of the manufacturing method for the component built-in module pertaining to the second embodiment in the present invention.
Figure 4C:
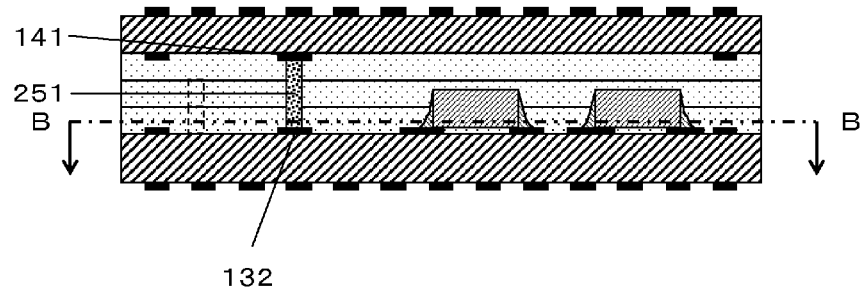
FIG. 4(C) is a schematic vertical sectional view for describing a state after a heat press in the heat press step of the manufacturing method for the component built-in module pertaining to the second embodiment in the present invention.

Here, FIG. 2(A) corresponds with a sectional view taken along line A-A (see FIG. 4(B)), and FIG. 2(B) corresponds with a sectional view taken along line B-B (see FIG. 4(C)).

The component built-in module, and the manufacturing method for the component built-in module pertaining to the present embodiment are analogous to those of the first embodiment described before, and accomplish similar effects.

And, the manufacturing method for the component built-in module pertaining to the present embodiment is characterized mainly by the following points compared with that of the first embodiment described before.

A flow vector Fa1 directed toward an electronic component 1004 has a direction that is parallel with a sheet member 1001, and has a magnitude that is proportional to a volume of a gap between the electronic component 1004 and a wall surface of a cavity 1003 and that is inversely proportional to a square of a distance between the center of a via hole 1002 and the center of the electronic component 1004.

A flow vector Fa2 directed toward an electronic component 1006 has a direction that is parallel with a sheet member 1001, and has a magnitude that is proportional to a volume of a gap between the electronic component 1006 and a wall surface of a cavity 1005 and that is inversely proportional to a square of a distance between the center of a via hole 1002 and the center of the electronic component 1006.

A flow vector Fb directed toward an adjustment space 1007 has a direction that is parallel with the sheet member 1001, and has a magnitude that is proportional to a volume of the adjustment space 1007 and that is inversely proportional to a square of a distance between the via hole 1002 and the adjustment space 1007.

Two electronic components 1004 and 1006, and two cavities 1003 and 1005 are formed respectively.

A flow vector Fa directed toward the electronic component is a composite vector composed of all of the flow vectors Fa1 and Fa2 directed toward the respective electronic components 1004 and 1006.

The resin is a heat-hardening resin.

The sheet member 1001 includes an inorganic filler.

The electronic components 1004 and 1006 are active components or passive components.

Next, the manufacturing method for the component built-in module pertaining to the present embodiment is described in more detail.

In the manufacturing method for the component built-in module pertaining to the present embodiment, a flow vector Fa directed toward an electronic component a during the heat press is defined by $$Fa=(K\,Va/Ra^2)Ua \qquad \text{(Expression 1)}$$

with
the volume Va of a gap between the electronic component a and the wall surface of the cavity,
the distance Ra between the center of the via hole and the center of the electronic component a,
a material constant K of the sheet member, and
the unit vector Ua directed toward the center of the electronic component a from the center of the via hole;
a flow vector Fb directed toward an adjustment space b during the heat press is defined by $$Fb=(K\,Vb/Rb^2)Ub \qquad \text{(Expression 2)}$$

with
the volume Vb of the adjustment space b,
the distance Rb between the center of the via hole and the center of the adjustment space b,
the material constant K of the sheet member (previously described), and
the unit vector Ub directed toward the center of the adjustment space b from the center of the via hole; and
the adjustment space b is formed so that the resin flow in a neighborhood of the via hole is balanced isotropically, namely, $$\Sigma Fa=-\Sigma Fb. \qquad \text{(Expression 3)}$$

Further, the summation in ΣFa is taken over the electronic components a's to be considered, and the summation in ΣFb is taken over the adjustment spaces b's to be considered.

Next, the manufacturing method for the component built-in module pertaining to the present embodiment is more concretely described that is for estimating the direction and amount of flow of a via flow in consideration of the arrangement direction of an electronic component and the distance between a via hole and an electronic component, not to mention the volume of the gap between an electronic component and a wall surface of a cavity, to form an adjustment space with appropriate arrangement direction, volume, and distance.

As shown in FIG. 2(A), the via hole 1002 filled up with a conductive paste is formed in the sheet member 1001, the electronic component 1004 is arranged in the cavity 1003, and the electronic component 1006 is arranged in the cavity 1005.

And, the adjustment space 1007 has been formed so that the resin flow in a neighborhood of the via hole 1002 is balanced isotropically.

The size of the electronic component 1004 is 0.6 mm×0.3 mm×0.3 mm, and the size of the cavity 1003 is 0.64 mm×0.34 mm×0.4 mm.

The size of the electronic component 1006 is 1.0 mm×0.5 mm×0.5 mm, and the size of the cavity 1005 is 1.04 mm×0.54 mm×0.6 mm.

The distance between the center of the via hole 1002 and the center of the electronic component 1004 is 1 mm.

The distance between the center of the via hole 1002 and the center of the electronic component 1006 is 2 mm.

Concerning the magnitude of the flow vector Fa1 directed toward the electronic component 1004, from (Expression 1), $$|Fa1|=K\times(0.64\times0.34\times0.4-0.6\times0.3\times0.3)/1^2,$$

namely, $$|Fa1|=0.033K;\text{ and}$$

concerning the magnitude of the flow vector Fa2 directed toward the electronic component 1006, from (Expression 1), $$|Fa2|=K\times(1.04\times0.54\times0.6-1.0\times0.5\times0.5)/2^2,$$

namely, $$|Fa2|=0.0218K.$$

Accordingly, $$|Fa1+Fa2|=K\times(0.033^2+0.0218^2)^{1/2},$$

namely, $$|Fa|=0.0395K.$$

Here, the flow vectors Fa1 and Fa2 are substantially orthogonal to each other.

Hence, for example, when the direction of the flow vector Fb is opposite to the direction of the flow vector Fa,
the via diameter of the adjustment space 1007 is 400 μm,
the via height of the adjustment space 1007 is 300 μm, and
the distance between the center of the adjustment space 1007 and the center of the via hole 1002 is 1 mm,
the resin flow in a neighborhood of the via hole 1002 is practically balanced isotropically.

Here, concerning the adjustment space 1007, from (Expression 2) and (Expression 3), $$Vb/Rb^2=0.0395.$$

Hence, when the adjustment space 1007 is for example formed as described before, as shown in FIG. 2(B), it is possible to suppress a via flow due to a heat press.

Next, mainly with reference to FIGS. 3 and 4, the manufacturing method for the component built-in module pertaining to the present embodiment is described in more detail.

Figure 3A:
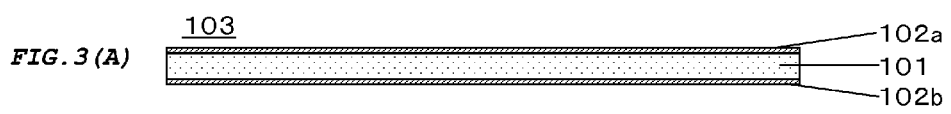
FIG. 3(A) is a schematic vertical sectional view for describing the gluing of the protective films related to the formation of the sheet member in which the cavity is formed, in the formation step of the manufacturing method for the component built-in module pertaining to the second embodiment in the present invention.
Figure 3B:
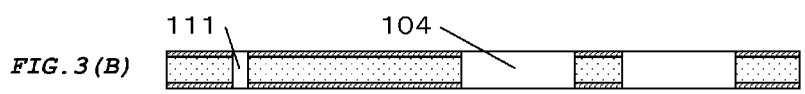
FIG. 3(B) is a schematic vertical sectional view for describing the formation of the cavity related to the formation of the sheet member in which the cavity and the adjustment space are formed, in the formation step of the manufacturing method for the component built-in module pertaining to the second embodiment in the present invention.
Figure 3C:
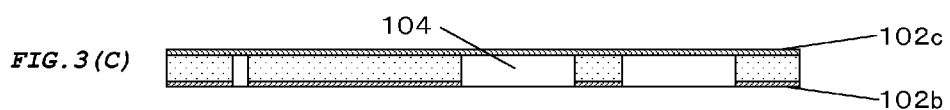
FIG. 3(C) is a schematic vertical sectional view for describing the gluing of the new protective film related to the formation of the sheet member in which the cavity is formed, in the formation step of the manufacturing method for the component built-in module pertaining to the second embodiment in the present invention.
Figure 3D:
FIG. 3(D) is a schematic vertical sectional view for describing the formation of the via hole related to the formation of the sheet member in which the cavity is formed, in the formation step of the manufacturing method for the component built-in module pertaining to the second embodiment in the present invention.
Figure 3E:
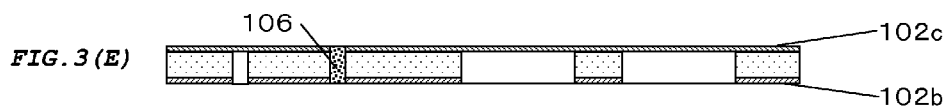
FIG. 3(E) is a schematic vertical sectional view for describing the filling up with the conductive paste related to the formation of the sheet member in which the cavity is formed, in the formation step of the manufacturing method for the component built-in module pertaining to the second embodiment in the present invention.
Figure 3F:
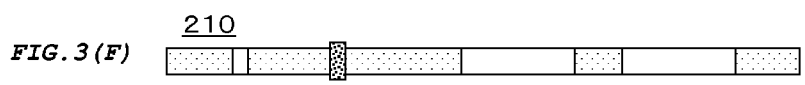
FIG. 3(F) is a schematic vertical sectional view for describing the peel-off of the protective films related to the formation of the sheet member in which the cavity is formed, in the formation step of the manufacturing method for the component built-in module pertaining to the second embodiment in the present invention.

Further, FIG. 3(A) is a schematic vertical sectional view for describing the gluing of the protective films 102a and 102b related to the formation of the sheet member 210 in which the cavity 104 is formed, in the formation step of the manufacturing method for the component built-in module pertaining to the second embodiment in the present invention, FIG. 3(B) is a schematic vertical sectional view for describing the formation of the cavity 104 related to the formation of the sheet member 210 in which the cavity 104 and the adjustment space 111 are formed, in the formation step of the manufacturing method for the component built-in module pertaining to the second embodiment in the present invention, FIG. 3(C) is a schematic vertical sectional view for describing the gluing of the new protective film 102c related to the formation of the sheet member 210 in which the cavity 104 is formed, in the formation step of the manufacturing method for the component built-in module pertaining to the second embodiment in the present invention, FIG. 3(D) is a schematic vertical sectional view for describing the formation of the via hole 105 related to the formation of the sheet member 210 in which the cavity 104 is formed, in the formation step of the manufacturing method for the component built-in module pertaining to the second embodiment in the present invention, FIG. 3(E) is a schematic vertical sectional view for describing the filling up with the conductive paste 106 related to the formation of the sheet member 210 in which the cavity 104 is formed, in the formation step of the manufacturing method for the component built-in module pertaining to the second embodiment in the present invention, and FIG. 3(F) is a schematic vertical sectional view for describing the peel-off of the protective films 102b and 102c related to the formation of the sheet member 210 in which the cavity 104 is formed, in the formation step of the manufacturing method for the component built-in module pertaining to the second embodiment in the present invention.

Furthermore, FIG. 4(A) is a schematic vertical sectional view for describing a state before a heat press in the heat press step of the manufacturing method for the component built-in module pertaining to the second embodiment in the present invention, FIG. 4(B) is a schematic vertical sectional view for describing a state during a heat press in the heat press step of the manufacturing method for the component built-in module pertaining to the second embodiment in the present invention, and FIG. 4(C) is a schematic vertical sectional view for describing a state after a heat press in the heat press step of the manufacturing method for the component built-in module pertaining to the second embodiment in the present invention.

In the manufacturing method for the component built-in module pertaining to the present embodiment, heating and pressurization are performed by a heat press while holding, with the first wiring substrate 130 on which the electronic component 131 is mounted and the second wiring substrate 140, both sides of an electric insulating sheet member 215 such that (1) two sheet members 210 and the sheet member 120, which are configured using the composite sheets 101, are stacked up, and (2) the sheet members 210, which the via hole 105 filled up with the conductive paste 106, and the cavity 104 and the adjustment space 111 penetrate, are laminated at least on one side of the sheet member 120.

Thus, the cavity 104 has the electronic component 131 built-in, a via conductor 251 formed using the conductive paste 106 is arranged between the first wiring pattern 132 and the second wiring pattern 141 that are formed on the first wiring substrate 130 and the second wiring substrate 140 respectively, and the first wiring pattern 132 and the second wiring pattern 141 are electrically connected by the via conductor 251.

Hereinafter, the manufacturing method for the component built-in module pertaining to the present embodiment is still more concretely described.

As shown in FIG. 3(A), the sheet member 103 with thickness of about 100 μm is formed by gluing the protective films 102a and 102b onto both faces of the unhardened composite sheet 101.

As shown in FIG. 3(B), the cavity 104 according to the shape of the built-in electronic component 131 (see FIG. 4(A)) and the adjustment space 111 are formed in the sheet member 103 by any of laser processing, punch processing and drill processing.

As shown in FIG. 3(C), an opening of the cavity 104 and an opening of the adjustment space 111 are stopped up by gluing the new protective film 102c after peeling off the protective film 102a on one side.

As shown in FIG. 3(D), the via hole 105 penetrating the sheet member 103 is formed by any of laser processing, punch processing and drill processing.

As shown in FIG. 3(E), the via hole 105 is filled up with the conductive paste 106 using a means such as a printing process and the like.

As shown in FIG. 3(F), the sheet member 210 is completed by peeling off the protective films 102b and 102c.

As shown in FIG. 4(A), the two sheet members 210 in which the cavities 104 (see FIG. 3(B)) and the adjustment space 111 (see FIG. 3(B)) are provided; the sheet member 120; the first wiring substrate 130 including the first wiring pattern 132, and the electronic component 131 mounted on the first wiring pattern 132; and the second wiring substrate 140 including the second wiring pattern 141 are aligned.

As shown in FIG. 4(B), a heat press is performed against the two sheet members 210, the sheet member 120, the first wiring substrate 130, and the second wiring substrate 140, which are aligned and stacked up.

Figure 10A:
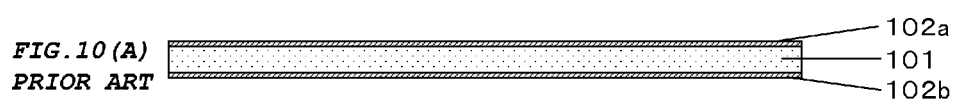
FIG. 10(A) is a schematic vertical sectional view for describing the gluing of the protective films related to the formation of the sheet member in which the cavity is not formed, in the formation step of the first conventional manufacturing method for the component built-in module.
Figure 10B:
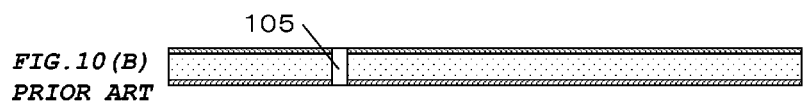
FIG. 10(B) is a schematic vertical sectional view for describing the formation of the via hole related to the formation of the sheet member in which the cavity is not formed, in the formation step of the first conventional manufacturing method for the component built-in module.
Figure 10C:
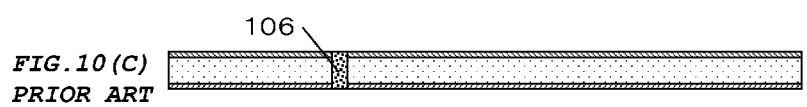
FIG. 10(C) is a schematic vertical sectional view for describing the filling up with the conductive paste related to the formation of the sheet member in which the cavity is not formed, in the formation step of the first conventional manufacturing method for the component built-in module.
Figure 10D:
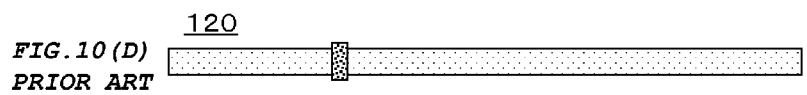
FIG. 10(D) is a schematic vertical sectional view for describing the peel-off of the protective films related to the formation of the sheet member in which the cavity is not formed, in the formation step of the first conventional manufacturing method for the component built-in module.
Figure 11A:
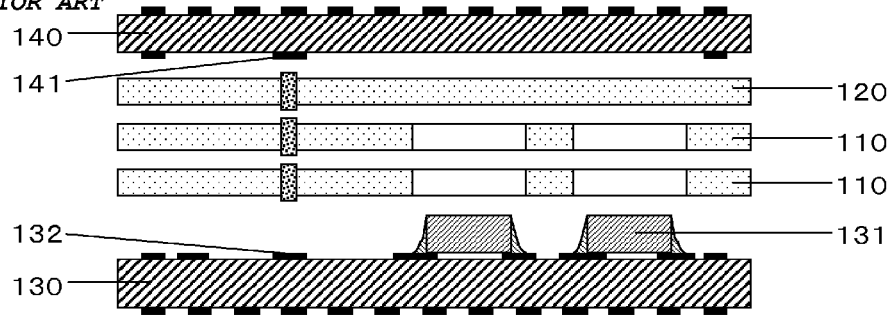
FIG. 11(A) is a schematic vertical sectional view for describing a state before a heat press in the heat press step of the first conventional manufacturing method for the component built-in module.
Figure 11B:
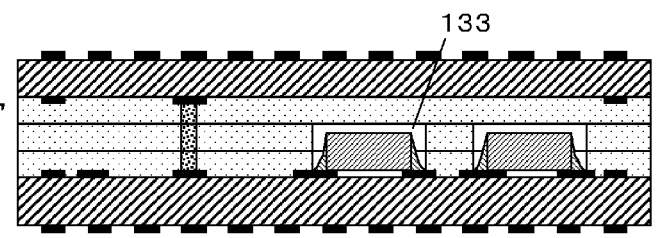
FIG. 11(B) is a schematic vertical sectional view for describing a state during a heat press in the heat press step of the first conventional manufacturing method for the component built-in module.
Figure 11C:
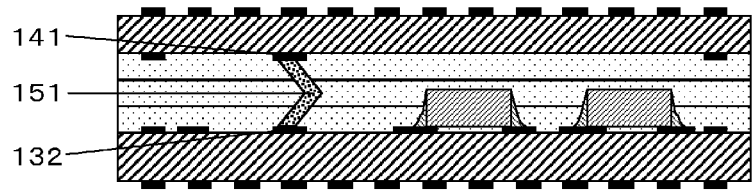
FIG. 11(C) is a schematic vertical sectional view for describing a state after a heat press in the heat press step of the first conventional manufacturing method for the component built-in module.
Figure 12A:
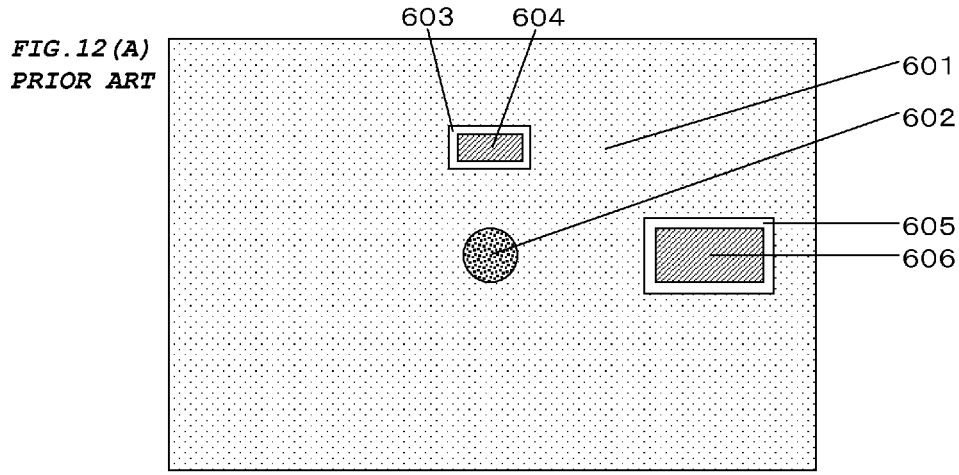
FIG. 12(A) is a schematic horizontal sectional view for describing a state during a heat press in the heat press step of the second conventional manufacturing method for the component built-in module.
Figure 12B:
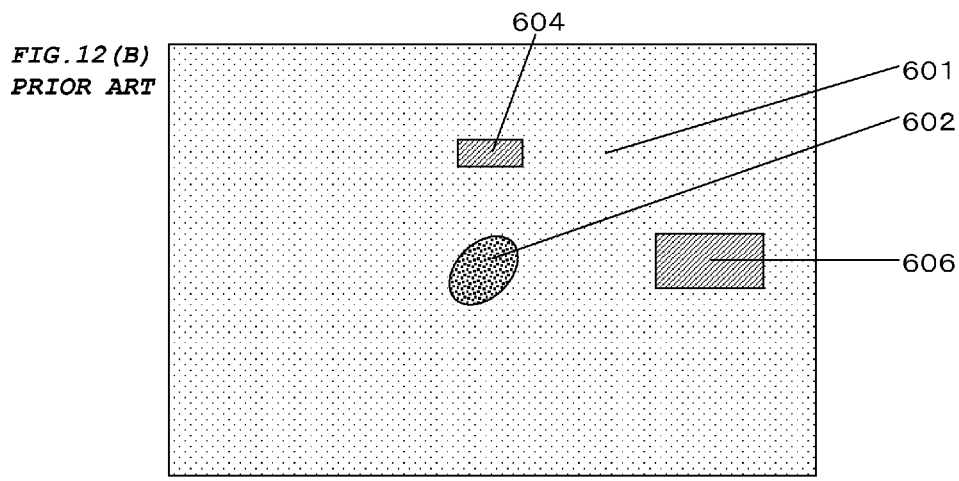
FIG. 12(B) is a schematic horizontal sectional view for describing a state after a heat press in the heat press step of the second conventional manufacturing method for the component built-in module.
Figure 13A:
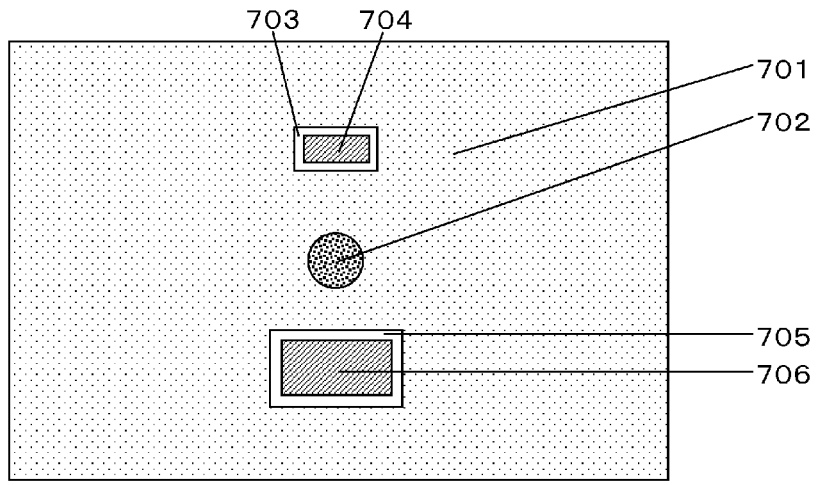
FIG. 13(A) is a schematic horizontal sectional view for describing a state during a heat press in the heat press step of the third conventional manufacturing method for the component built-in module.
Figure 13B:
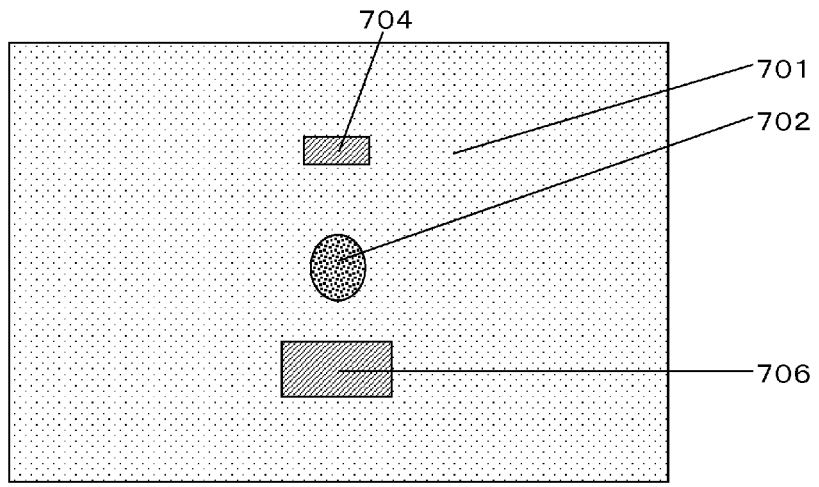
FIG. 13(B) is a schematic horizontal sectional view for describing a state after a heat press in the heat press step of the third conventional manufacturing method for the component built-in module.
Figure 14:
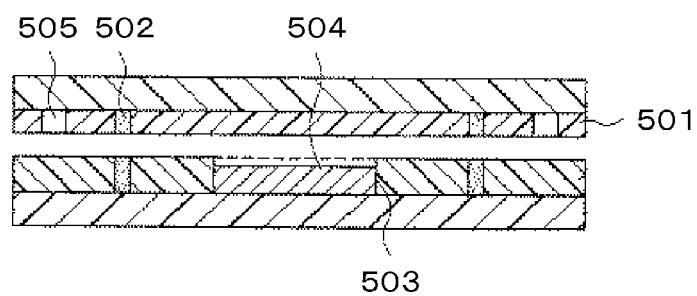
FIG. 14 is a schematic vertical sectional view for describing a state before a heat press in the heat press step of the fourth conventional manufacturing method for the component built-in module.
Figure 15A:
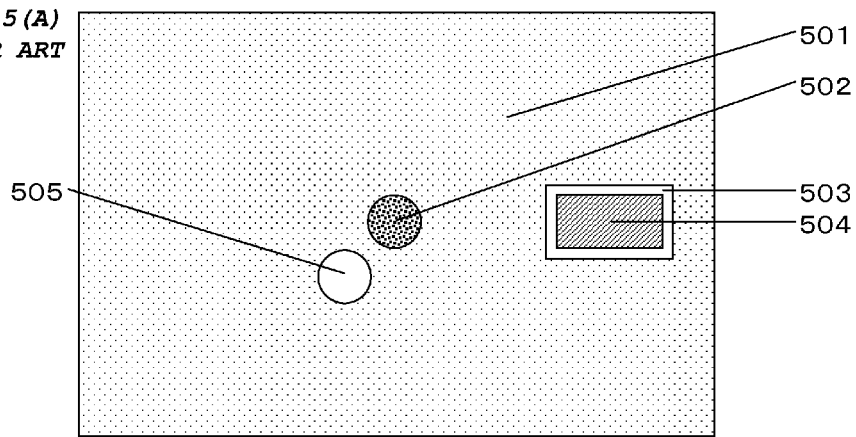
FIG. 15(A) is a schematic horizontal sectional view for describing a state during a heat press in the heat press step of the fourth conventional manufacturing method for the component built-in module.
Figure 15B:
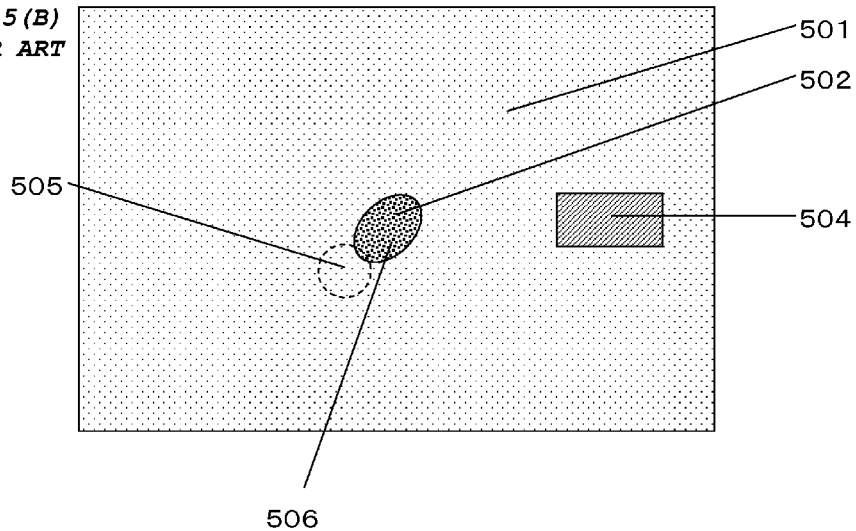
FIG. 15(B) is a schematic horizontal sectional view for describing a state after a heat press in the heat press step of the fourth conventional manufacturing method for the component built-in module.

As shown in FIG. 4(C), the component built-in module is finally manufactured in which the first wiring pattern 132 and the second wiring pattern 141 are electrically connected by the via conductor 251 formed using the conductive paste 106 (see FIG. 3(E) and FIG. 10(C)).

Of course, both concerning the configuration, the number and the like of the sheet members 210 and 120, and the first wiring substrate 130 and the second wiring substrate 140, and concerning the order and the like in which these are stacked up, the concrete example described above is only an example, and various modified examples can be considered (the same applies to other embodiments).

As first and second composite sheets or a third composite sheet, corresponding to the composite sheet 101 used in order to configure each of the two sheet members 210, or in order to configure the sheet member 120, for example, a composite sheet with flow viscosity of 1000 to 20000 Pa·s at 120° C. that includes 70 to 95 wt % of inorganic filler and 5 to 30 wt % of a heat-hardening resin composition in the unhardened state can be used.

Further, if the inorganic filler content is less than 70 wt %, or the flow viscosity is less than 1000 Pa·s, since the viscosity of the composite sheet rapidly lowers in a heat press process and the fluidity increases, it is feared that the via conductor will be deformed.

Furthermore, if the inorganic filler content exceeds 95 wt %, or the flow viscosity exceeds 20000 Pa·s, since the viscosity of the composite sheet is too high, it is feared that formability will be deteriorated.

As inorganic filler, for example, $Al_2O_3$, $MgO$, $BN$, $AlN$, or $SiO_2$ can be used.

As a heat-hardening resin composition, for example, a composition whose principal component is epoxy resin, phenolic resin, or cyanate resin can be used.

The thickness of the first and second composite sheets or the third composite sheet may be, for example, 50 to 600 μm or 50 to 100 μm respectively.

In a case where plural sheet members are laminated, for example, a vacuum laminating machine may be used.

A lamination condition in which the temperature is 100° C. or less and the pressure is 1 MPa or less is preferable.

Further, under a lamination condition in which the temperature exceeds 100° C., it is feared that the cavity will be deformed.

A lamination condition, in which the temperature is 30° C. or more and the pressure is 0.05 MPa or more, is preferable in order to maintain the adhesion of the sheet members excellently.

The diameter of the via hole penetrating the electric insulating sheet member in which plural sheet members are stacked up may be, for example, 50 to 200 μm.

As a conductive paste with which the via hole is filled up, for example, a paste can be used that includes conductive powders including metal such as silver, copper, gold, nickel or the like, and heat-hardening resin such as epoxy resin and the like.

As base material of first and second wiring substrates, corresponding to the first wiring substrate 130 and the second wiring substrate 140 respectively, for example, electric insulating base material such as glass, epoxy base material or the like can be used.

First and second wiring patterns, corresponding to the first wiring pattern 132 and the second wiring pattern 141 respectively, may be formed, for example, using photolithographic technique, by carrying out patterning of metallic foil such as copper foil and the like bonded on the electric insulating base material by a heat press.

The heights and pitches of the first and second wiring patterns may be, for example, 5 to 30 μm and 20 to 200 μm respectively.

As an electronic component, corresponding to the electronic component 131, for example, an active component such as a semiconductor and the like, or a passive component such as a capacitor and the like can be used.

Thus, even in a case where a plurality of electronic components are mounted, since an adjustment space is formed so that the resin flow in a neighborhood of a via hole is balanced isotropically, a via flow is suppressed, and it becomes possible to cheaply provide a component built-in module with excellent electrical connection realized.

Third Embodiment

Mainly with reference to FIG. 5, a component built-in module, and a manufacturing method for the component built-in module pertaining to the present embodiment are described.

Further, FIG. 5(A) is a schematic horizontal sectional view for describing a state during a heat press in the heat press step of the manufacturing method for the component built-in module pertaining to the third embodiment in the present invention, and FIG. 5(B) is a schematic horizontal sectional view for describing a state after a heat press in the heat press step of the manufacturing method for the component built-in module pertaining to the third embodiment in the present invention.

The component built-in module, and the manufacturing method for the component built-in module pertaining to the present embodiment are analogous to those of the second embodiment described before, and accomplish similar effects.

And, the manufacturing method for the component built-in module pertaining to the present embodiment is characterized mainly by the following points compared with that of the second embodiment described before.

A flow vector Ga1 directed toward an electronic component 1104 has a direction that is parallel with a sheet member 1101, and has a magnitude that is proportional to a volume of a gap between the electronic component 1104 and a wall surface of a cavity 1103 and that is inversely proportional to a square of a distance between the center of a via hole 1102 and the center of the electronic component 1104.

A flow vector Ga2 directed toward an electronic component 1106 has a direction that is parallel with a sheet member 1101, and has a magnitude that is proportional to a volume of a gap between the electronic component 1106 and a wall surface of a cavity 1105 and that is inversely proportional to a square of a distance between the center of a via hole 1102 and the center of the electronic component 1106.

A flow vector Gb1 directed toward an adjustment space 1107 has a direction that is parallel with the sheet member 1101, and has a magnitude that is proportional to a volume of the adjustment space 1107 and that is inversely proportional to a square of a distance between the center of the via hole 1102 and the center of the adjustment space 1107.

A flow vector Gb2 directed toward an adjustment space 1108 has a direction that is parallel with the sheet member 1101, and has a magnitude that is proportional to a volume of the adjustment space 1108 and that is inversely proportional to a square of a distance between the center of the via hole 1102 and the center of the adjustment space 1108.

A flow vector Gb3 directed toward an adjustment space 1109 has a direction that is parallel with the sheet member 1101, and has a magnitude that is proportional to a volume of the adjustment space 1109 and that is inversely proportional to a square of a distance between the center of the via hole 1102 and the center of the adjustment space 1109.

A flow vector Ga directed toward the electronic component is a composite vector composed of the flow vectors Ga1 and Ga2 of a part of the flow vectors directed toward the respective electronic components.

Three adjustment spaces 1107, 1108 and 1109 are formed.

A flow vector Gb directed toward the adjustment space is a composite vector composed of the flow vectors Gb1, Gb2 and Gb3 directed toward the respective adjustment spaces 1107, 1108 and 1109.

Next, the manufacturing method for the component built-in module pertaining to the present embodiment is described in more detail.

Meanwhile, it is of course desirable to consider the influence of all the electronic components on a via hole but, in a case where there are numerous built-in electronic components, it is possible that this will lead to difficulty in designing an arrangement state and the like of adjustment spaces.

So, since, as will be understood also from (Expression 1), an influence of electronic components that neighbor a via hole is extremely great, the influence only of the electronic components that neighbor the via hole is considered in order to design an arrangement state and the like of adjustment spaces with less difficulty.

More concretely, as shown in FIG. 5(A), the via hole 1102 filled up with a conductive paste is formed in the sheet member 1101, the electronic component 1104 is arranged in the cavity 1103, and the electronic component 1106 is arranged in the cavity 1105.

And, the adjustment spaces 1107, 1108 and 1109 are formed so that the resin flow in a neighborhood of the via hole 1102 is balanced isotropically.

Here, the influence of the other electronic components except the electronic components 1104 and 1106, which do not neighbor the via hole 1102, is not considered.

The size of the electronic component 1104 is 0.6 mm×0.3 mm×0.3 mm, and the size of the cavity 1103 is 0.64 mm×0.34 mm×0.4 mm.

The size of the electronic component 1106 is 1.0 mm×0.5 mm×0.5 mm, and the size of the cavity 1105 is 1.04 mm×0.54 mm×0.6 mm.

The distance between the center of the via hole 1102 and the center of the electronic component 1104 is 1 mm.

The distance between the center of the via hole 1102 and the center of the electronic component 1106 is 1 mm.

Concerning the magnitude of the flow vector Ga1 directed toward the electronic component 1104, from (Expression 1), $$|Ga1|=K\times(0.64\times0.34\times0.4-0.6\times0.3\times0.3)/1^2,$$

namely, $$|Ga1|=0.033K;\text{ and}$$

concerning the magnitude of the flow vector Ga2 directed toward the electronic component 1106, from (Expression 1), $$|Ga2|=K\times(1.04\times0.54\times0.6-1.0\times0.5\times0.5)/1^2,$$

namely, $$|Ga2|=0.087K.$$

Hence, for example, when the direction of the flow vector Gb1 is opposite to the direction of the flow vector Ga1,
the via diameter of the adjustment space 1107 is 400 μm,
the via height of the adjustment space 1107 is 260 μm, and
the distance between the center of the adjustment space 1107 and the center of the via hole 1102 is 1 mm; and
the direction of a composite vector composed of the flow vectors Gb2 and Gb3 is opposite to the direction of the flow vector Ga2,
the via diameters of the adjustment spaces 1108 and 1109 are 400 μm,
the via heights of the adjustment spaces 1108 and 1109 are 350 μm,
the distance between the center of the adjustment space 1108 and the center of the via hole 1102 is 1 mm, and
the distance between the center of the adjustment space 1109 and the center of the via hole 1102 is 1 mm,
the resin flow in a neighborhood of the via hole 1102 is practically balanced isotropically.

Here, the adjustment spaces 1108 and 1109 are formed substantially at the same position, and the flow vectors Gb2 and Gb3 have substantially the same horizontal component, and substantially zero vertical component.

Thus, even in a case where a plurality of adjustment spaces are formed and the influence only of the electronic components that neighbor a via hole is considered in order to design an arrangement state and the like of the adjustment spaces with less difficulty, since an adjustment space is formed so that the resin flow in a neighborhood of a via hole is balanced isotropically, a via flow is suppressed, and it becomes possible to cheaply provide a component built-in module with excellent electrical connection realized.

Fourth Embodiment

Mainly with reference to FIGS. 6 to 8, a component built-in module, and a manufacturing method for the component built-in module pertaining to the present embodiment are described.

Figure 6A:
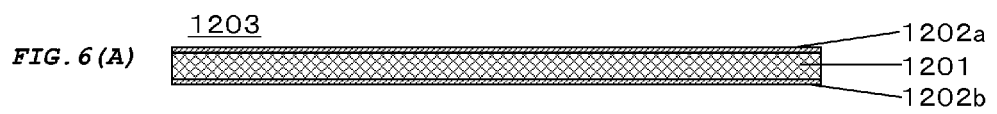
FIG. 6(A) is a schematic vertical sectional view for describing the gluing of the protective films related to the formation of the sheet member in which the cavity is formed, in the formation step of the manufacturing method for the component built-in module pertaining to the fourth embodiment in the present invention.
Figure 6B:
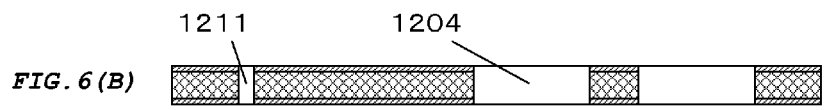
FIG. 6(B) is a schematic vertical sectional view for describing the formation of the cavity related to the formation of the sheet member in which the cavity and the adjustment space are formed, in the formation step of the manufacturing method for the component built-in module pertaining to the fourth embodiment in the present invention.
Figure 6C:
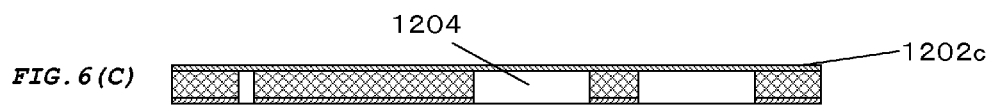
FIG. 6(C) is a schematic vertical sectional view for describing the gluing of the new protective film related to the formation of the sheet member in which the cavity is formed, in the formation step of the manufacturing method for the component built-in module pertaining to the fourth embodiment in the present invention.
Figure 6D:
FIG. 6(D) is a schematic vertical sectional view for describing the formation of the via hole related to the formation of the sheet member in which the cavity is formed, in the formation step of the manufacturing method for the component built-in module pertaining to the fourth embodiment in the present invention.
Figure 6E:
FIG. 6(E) is a schematic vertical sectional view for describing the filling up with the conductive paste related to the formation of the sheet member in which the cavity is formed, in the formation step of the manufacturing method for the component built-in module pertaining to the fourth embodiment in the present invention.
Figure 6F:
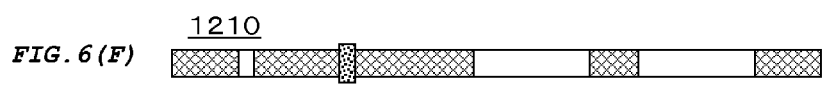
FIG. 6(F) is a schematic vertical sectional view for describing the peel-off of the protective films related to the formation of the sheet member in which the cavity is formed, in the formation step of the manufacturing method for the component built-in module pertaining to the fourth embodiment in the present invention.

Further, FIG. 6(A) is a schematic vertical sectional view for describing the gluing of the protective films 1202a and 1202b related to the formation of the sheet member 1210 in which the cavity 1204 is formed, in the formation step of the manufacturing method for the component built-in module pertaining to the fourth embodiment in the present invention, FIG. 6(B) is a schematic vertical sectional view for describing the formation of the cavity 1204 related to the formation of the sheet member 1210 in which the cavity 1204 and the adjustment space 1211 are formed, in the formation step of the manufacturing method for the component built-in module pertaining to the fourth embodiment in the present invention, FIG. 6(C) is a schematic vertical sectional view for describing the gluing of the new protective film 1202c related to the formation of the sheet member 1210 in which the cavity 1204 is formed, in the formation step of the manufacturing method for the component built-in module pertaining to the fourth embodiment in the present invention, FIG. 6(D) is a schematic vertical sectional view for describing the formation of the via hole 1205 related to the formation of the sheet member 1210 in which the cavity 1204 is formed, in the formation step of the manufacturing method for the component built-in module pertaining to the fourth embodiment in the present invention, FIG. 6(E) is a schematic vertical sectional view for describing the filling up with the conductive paste 1206 related to the formation of the sheet member 1210 in which the cavity 1204 is formed, in the formation step of the manufacturing method for the component built-in module pertaining to the fourth embodiment in the present invention, and FIG. 6(F) is a schematic vertical sectional view for describing the peel-off of the protective films 1202b and 1202c related to the formation of the sheet member 1210 in which the cavity 1204 is formed, in the formation step of the manufacturing method for the component built-in module pertaining to the fourth embodiment in the present invention.

Figure 7A:
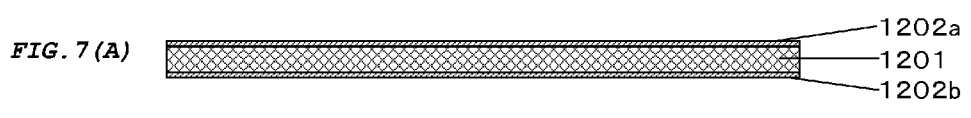
FIG. 7(A) is a schematic vertical sectional view for describing the gluing of the protective films related to the formation of the sheet member in which the cavity is not formed, in the formation step of the manufacturing method for the component built-in module pertaining to the fourth embodiment in the present invention.
Figure 7B:
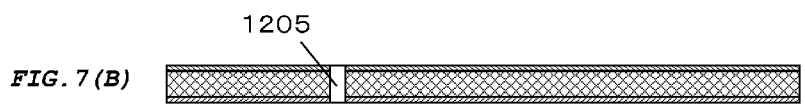
FIG. 7(B) is a schematic vertical sectional view for describing the formation of the via hole related to the formation of the sheet member in which the cavity is not formed, in the formation step of the manufacturing method for the component built-in module pertaining to the fourth embodiment in the present invention.
Figure 7C:
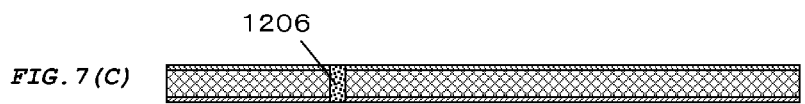
FIG. 7(C) is a schematic vertical sectional view for describing the filling up with the conductive paste related to the formation of the sheet member in which the cavity is not formed, in the formation step of the manufacturing method for the component built-in module pertaining to the fourth embodiment in the present invention.
Figure 7D:
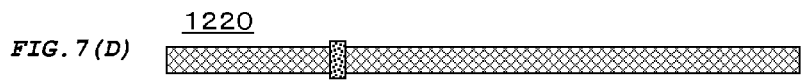
FIG. 7(D) is a schematic vertical sectional view for describing the peel-off of the protective films related to the formation of the sheet member in which the cavity is not formed, in the formation step of the manufacturing method for the component built-in module pertaining to the fourth embodiment in the present invention.

Furthermore, FIG. 7(A) is a schematic vertical sectional view for describing the gluing of the protective films 1202a and 1202b related to the formation of the sheet member 1220 in which the cavity 1204 is not formed, in the formation step of the manufacturing method for the component built-in module pertaining to the fourth embodiment in the present invention, FIG. 7(B) is a schematic vertical sectional view for describing the formation of the via hole 1205 related to the formation of the sheet member 1220 in which the cavity 1204 is not formed, in the formation step of the manufacturing method for the component built-in module pertaining to the fourth embodiment in the present invention, FIG. 7(C) is a schematic vertical sectional view for describing the filling up with the conductive paste 1206 related to the formation of the sheet member 1220 in which the cavity 1204 is not formed, in the formation step of the manufacturing method for the component built-in module pertaining to the fourth embodiment in the present invention, and FIG. 7(D) is a schematic vertical sectional view for describing the peel-off of the protective films 1202a and 1202b related to the formation of the sheet member 1220 in which the cavity 1204 is not formed, in the formation step of the manufacturing method for the component built-in module pertaining to the fourth embodiment in the present invention.

Figure 8A:
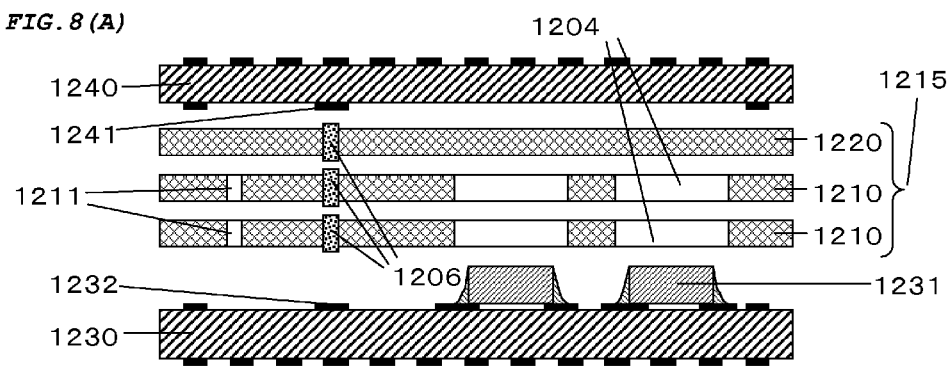
FIG. 8(A) is a schematic vertical sectional view for describing a state before a heat press in the heat press step of the manufacturing method for the component built-in module pertaining to the fourth embodiment in the present invention.
Figure 8B:
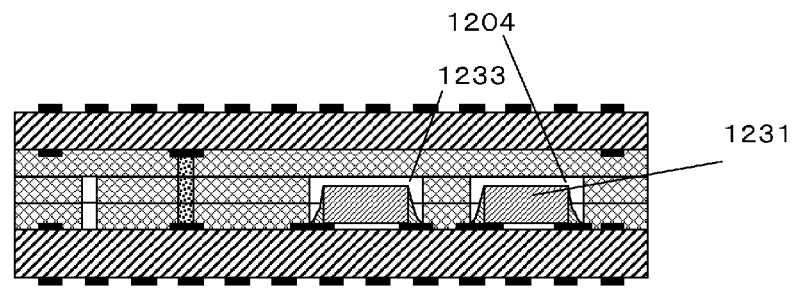
FIG. 8(B) is a schematic vertical sectional view for describing a state during a heat press in the heat press step of the manufacturing method for the component built-in module pertaining to the fourth embodiment in the present invention.
Figure 8C:
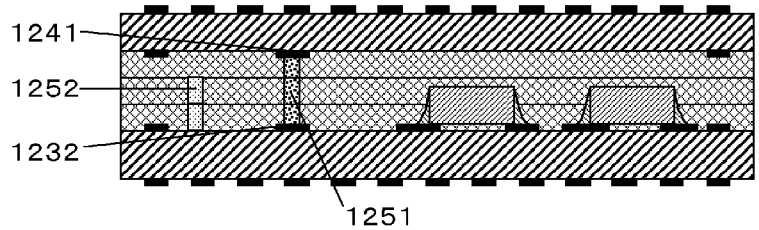
FIG. 8(C) is a schematic vertical sectional view for describing a state after a heat press in the heat press step of the manufacturing method for the component built-in module pertaining to the fourth embodiment in the present invention.
Figure 9A:
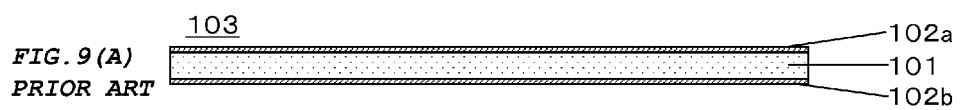
FIG. 9(A) is a schematic vertical sectional view for describing the gluing of the protective films related to the formation of the sheet member in which the cavity is formed, in the formation step of the first conventional manufacturing method for the component built-in module.
Figure 9B:
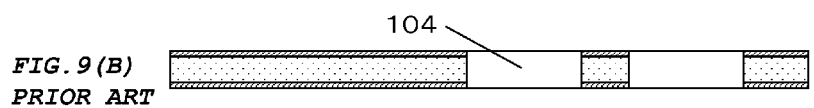
FIG. 9(B) is a schematic vertical sectional view for describing the formation of the cavity related to the formation of the sheet member in which the cavity is formed, in the formation step of the first conventional manufacturing method for the component built-in module.
Figure 9C:
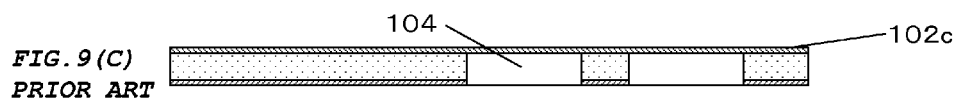
FIG. 9(C) is a schematic vertical sectional view for describing the gluing of the new protective film related to the formation of the sheet member in which the cavity is formed, in the formation step of the first conventional manufacturing method for the component built-in module.
Figure 9D:
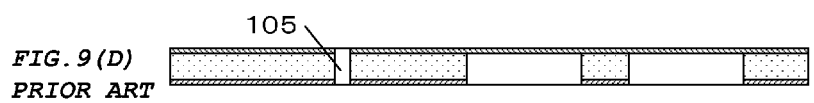
FIG. 9(D) is a schematic vertical sectional view for describing the formation of the via hole related to the formation of the sheet member in which the cavity is formed, in the formation step of the first conventional manufacturing method for the component built-in module.
Figure 9E:
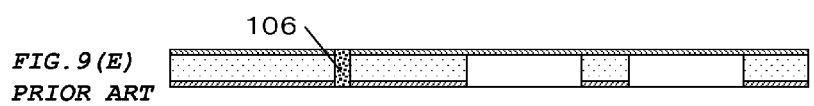
FIG. 9(E) is a schematic vertical sectional view for describing the filling up with the conductive paste related to the formation of the sheet member in which the cavity is formed, in the formation step of the first conventional manufacturing method for the component built-in module.
Figure 9F:
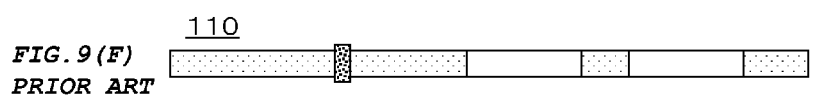
FIG. 9(F) is a schematic vertical sectional view for describing the peel-off of the protective films related to the formation of the sheet member in which the cavity is formed, in the formation step of the first conventional manufacturing method for the component built-in module.

Furthermore, FIG. 8(A) is a schematic vertical sectional view for describing a state before a heat press in the heat press step of the manufacturing method for the component built-in module pertaining to the fourth embodiment in the present invention, FIG. 8(B) is a schematic vertical sectional view for describing a state during a heat press in the heat press step of the manufacturing method for the component built-in module pertaining to the fourth embodiment in the present invention, and FIG. 8(C) is a schematic vertical sectional view for describing a state after a heat press in the heat press step of the manufacturing method for the component built-in module pertaining to the fourth embodiment in the present invention.

The component built-in module, and the manufacturing method for the component built-in module pertaining to the present embodiment are analogous to those of the second embodiment described before, and accomplish similar effects.

And, the manufacturing method for the component built-in module pertaining to the present embodiment is characterized mainly by the following points compared with that of the second embodiment described before.

A sheet member 1210 includes a core member of any of glass woven fabric, glass nonwoven fabric, aramid woven fabric, and aramid nonwoven fabric.

An adjustment space 1211 is filled up only with the resin during the heat press.

Next, the manufacturing method for the component built-in module pertaining to the present embodiment is described in more detail.

In the manufacturing method for the component built-in module pertaining to the present embodiment, heating and pressurization are performed by a heat press while holding, with a first wiring substrate 1230 on which an electronic component 1231 is mounted and a second wiring substrate 1240, both sides of an electric insulating sheet member 1215 such that (1) two sheet members 1210 and a sheet member 1220, which are configured using prepreg sheets 1201, are stacked up, and (2) the sheet members 1210, which a via hole 1205 filled up with a conductive paste 1206, and a cavity 1204 and the adjustment space 1211 penetrate, are laminated at least on one side of the sheet member 1220.

Thus, the cavity 1204 has the electronic component 1231 built-in, a via conductor 1251 formed using the conductive paste 1206 is arranged between a first wiring pattern 1232 and a second wiring pattern 1241 that are formed on the first wiring substrate 1230 and the second wiring substrate 1240 respectively, and the first wiring pattern 1232 and the second wiring pattern 1241 are electrically connected by the via conductor 1251.

The adjustment space 1211 that was formed in the unhardened prepreg sheet 1201 including the core member becomes, after the heat press, a region only of the resin including no core members.

Hereinafter, the manufacturing method for the component built-in module pertaining to the present embodiment is more concretely described.

As shown in FIG. 6(A), a sheet member 1203 with thickness of about 100 μm is formed by gluing protective films 1202a and 1202b onto both faces of the unhardened prepreg sheet 1201 including the core member.

As shown in FIG. 6(B), the cavity 1204 according to the shape of the built-in electronic component 1231 (see FIG. 8(A)) and the adjustment space 1211 are formed in the sheet member 1203 by any of laser processing, punch processing and drill processing.

As shown in FIG. 6(C), an opening of the cavity 1204 and an opening of the adjustment space 1211 are stopped up by gluing a new protective film 1202c after peeling off the protective film 1202a on one side.

As shown in FIG. 6(D), the via hole 1205 penetrating the sheet member 1203 is formed by any of laser processing, punch processing and drill processing.

As shown in FIG. 6(E), the via hole 1205 is filled up with the conductive paste 1206 using a means such as a printing process and the like.

As shown in FIG. 6(F), the sheet member 1210 is completed by peeling off the protective films 1202b and 1202c.

As shown in FIGS. 7(A) to 7(D), the sheet member 1220 is prepared by a process that is, except that the cavity 1204 is not formed, similar to the process of forming the sheet member 1210 described above.

Here, the sheet member 1220 fulfills the role of preventing the interference between the built-in electronic component 1231 (see FIG. 8(A)) and the second wiring substrate 1240 (see FIG. 8(A)).

As shown in FIG. 8(A), the two sheet members 1210 in which the cavities 1204 (see FIG. 6(B)) and the adjustment space 1211 (see FIG. 6(B)) are provided; the sheet member 1220; the first wiring substrate 1230 including the first wiring pattern 1232, and the electronic component 1231 mounted on the first wiring pattern 1232; and the second wiring substrate 1240 including the second wiring pattern 1241 are aligned.

As shown in FIG. 8(B), a heat press is performed against the two sheet members 1210, the sheet member 1220, the first wiring substrate 1230, and the second wiring substrate 1240, which are aligned and stacked up.

As shown in FIG. 8(C), the component built-in module is finally manufactured in which the first wiring pattern 1232 and the second wiring pattern 1241 are electrically connected by the via conductor 1251 formed using the conductive paste 1206 (see FIG. 6(E) and FIG. 7(C)).

Of course, the adjustment space 1211 that was formed in the unhardened prepreg sheet 1201 including the core member becomes, after the heat press, a region only of the resin including no core members.

Thus, even in a case where a prepreg sheet including a core member is used, since an adjustment space is formed so that the resin flow in a neighborhood of a via hole is balanced isotropically, a via flow is suppressed, and it becomes possible to cheaply provide a component built-in module with excellent electrical connection realized.

The component built-in module, and the manufacturing method for the component built-in module in the present invention are capable of suppressing a via flow that could be a cause of an electrical connection defect, and are valuable for use in, for example, having electronic components built-in using electric insulating sheet members, for example.

What is claimed is:

1. A manufacturing method for a component built-in module, comprising:
    forming, in a sheet member including resin, a via hole filled up with a conductive paste, a cavity in which an electronic component is to be built, and an adjustment space; and
    performing a heat press allowing the sheet member to abut against a substrate on which the electronic component has been mounted, wherein
    the adjustment space is formed so that a flow vector of the resin in a neighborhood of the via hole during the heat press, which is directed toward the electronic component, is cancelled by a flow vector of the resin in a neighborhood of the via hole during the heat press, which is directed toward the adjustment space.

2. A manufacturing method for a component built-in module according to claim 1, wherein
    the flow vector directed toward the electronic component has a direction that is parallel with the sheet member, and has a magnitude that is proportional to a volume of a gap between the electronic component and a wall surface of the cavity and that is inversely proportional to a square of a distance between the via hole and the electronic component, and
    the flow vector directed toward the adjustment space has a direction that is parallel with the sheet member, and has a magnitude that is proportional to a volume of the adjustment space and that is inversely proportional to a square of a distance between the via hole and the adjustment space.

3. A manufacturing method for a component built-in module according to claim 2, wherein
    a plurality of the electronic components and the cavities are formed respectively, and
    the flow vector directed toward the electronic component is a composite vector composed of all or part of the flow vectors directed toward the respective electronic components.

4. A manufacturing method for a component built-in module according to claim 3, wherein
    the flow vector directed toward the electronic component is a composite vector composed of flow vectors of a part of the flow vectors directed toward the respective electronic components.

5. A manufacturing method for a component built-in module according to claim 2, wherein
    a plurality of the adjustment spaces are formed, and
    the flow vector directed toward the adjustment space is a composite vector composed of the flow vectors directed toward the respective adjustment spaces.

6. A manufacturing method for a component built-in module according to claim 1, wherein
    the resin is a heat-hardening resin, and
    the sheet member includes an inorganic filler.

7. A manufacturing method for a component built-in module according to claim 1, wherein
    the sheet member includes a core member of any of glass woven fabric, glass nonwoven fabric, aramid woven fabric, and aramid nonwoven fabric.

8. A manufacturing method for a component built-in module according to claim 7, wherein
    the adjustment space is filled up only with the resin during the heat press.

9. A manufacturing method for a component built-in module according to claim 1, wherein
    the electronic component is an active component or a passive component.

* * * * *